US011637233B2

(12) United States Patent
Wang et al.

(10) Patent No.: US 11,637,233 B2
(45) Date of Patent: Apr. 25, 2023

(54) SEMICONDUCTOR DEVICE AND METHOD FOR FABRICATING THE SAME

(71) Applicant: UNITED MICROELECTRONICS CORP., Hsin-Chu (TW)

(72) Inventors: Hui-Lin Wang, Taipei (TW); Chen-Yi Weng, New Taipei (TW); Si-Han Tsai, Taichung (TW); Che-Wei Chang, Taichung (TW); Po-Kai Hsu, Tainan (TW); Jing-Yin Jhang, Tainan (TW); Yu-Ping Wang, Hsinchu (TW); Ju-Chun Fan, Tainan (TW); Ching-Hua Hsu, Kaohsiung (TW); Yi-Yu Lin, Taichung (TW); Hung-Yueh Chen, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 160 days.

(21) Appl. No.: 17/086,447

(22) Filed: Nov. 1, 2020

(65) Prior Publication Data
US 2022/0102621 A1    Mar. 31, 2022

(30) Foreign Application Priority Data
Sep. 30, 2020   (CN) .......................... 202011058791.5

(51) Int. Cl.
| H01L 43/02 | (2006.01) |
| H01L 43/12 | (2006.01) |
| H01L 27/22 | (2006.01) |
| H01L 43/10 | (2006.01) |

(52) U.S. Cl.
CPC ............ *H01L 43/02* (2013.01); *H01L 27/222* (2013.01); *H01L 43/12* (2013.01); *H01L 43/10* (2013.01)

(58) Field of Classification Search
CPC .. H01L 43/02; H01L 27/222; H01L 21/76807
See application file for complete search history.

(56) References Cited

U.S. PATENT DOCUMENTS

| 6,610,615 | B1 * | 8/2003 | McFadden | ........ H01L 21/02332 257/E21.268 |
| 2016/0020383 | A1 * | 1/2016 | Kang | ...................... H01L 43/02 257/421 |
| 2021/0083178 | A1 * | 3/2021 | Hsu | ........................ G11C 11/161 |
| 2021/0233805 | A1 * | 7/2021 | Chen | ................. H01L 21/76829 |

OTHER PUBLICATIONS

Liu, the specification, including the claims, and drawings in the U.S. Appl. No. 16/455,674, filed Jun. 27, 2019.

* cited by examiner

*Primary Examiner* — Shih Tsun A Chou
(74) *Attorney, Agent, or Firm* — Winston Hsu

(57) ABSTRACT

A method for fabricating a semiconductor device includes the steps of forming a magnetic tunneling junction (MTJ) on a MRAM region of a substrate, forming a first inter-metal dielectric (IMD) layer around the MTJ, forming a patterned mask on a logic region of the substrate, performing a nitridation process to transform part of the first IMD layer to a nitride layer, forming a first metal interconnection on the logic region, forming a stop layer on the first IMD layer, forming a second IMD layer on the stop layer, and forming a second metal intercom in the second IMD layer to connect to the MTJ.

5 Claims, 6 Drawing Sheets

SEMICONDUCTOR DEVICE AND METHOD FOR FABRICATING THE SAME

BACKGROUND OF THE INVENTION

1. Field of the Invention

The invention relates to a semiconductor device, and more particularly to a magnetoresistive random access memory (MRAM).

2. Description of the Prior Art

Magnetoresistance (MR) effect has been known as a kind of effect caused by altering the resistance of a material through variation of outside magnetic field. The physical definition of such effect is defined as a variation in resistance obtained by dividing a difference in resistance under no magnetic interference by the original resistance. Currently, MR effect has been successfully utilized in production of hard disks thereby having important commercial values. Moreover, the characterization of utilizing GMR materials to generate different resistance under different magnetized states could also be used to fabricate MRAM devices, which typically has the advantage of keeping stored data even when the device is not connected to an electrical source.

The aforementioned MR effect has also been used in magnetic field sensor areas including but not limited to for example electronic compass components used in global positioning system (GPS) of cellular phones for providing information regarding moving location to users. Currently, various magnetic field sensor technologies such as anisotropic magnetoresistance (AMR) sensors, GMR sensors, magnetic tunneling junction (MTJ) sensors have been widely developed in the market. Nevertheless, most of these products still pose numerous shortcomings such as high chip area, high cost, high power consumption, limited sensibility, and easily affected by temperature variation and how to come up with an improved device to resolve these issues has become an important task in this field.

SUMMARY OF THE INVENTION

According to an embodiment of the present invention, a method for fabricating a semiconductor device includes the steps of forming a magnetic tunneling junction (MTJ) on a MRAM region of a substrate, forming a first inter-metal dielectric (IMD) layer around the MTJ, forming a patterned mask on a logic region of the substrate, performing a nitridation process to transform part of the first IMD layer to a nitride layer, forming a first metal interconnection on the logic region, forming a stop layer on the first IMD layer, forming a second IMD layer on the stop layer, and forming a second metal intercom in the second IMD layer to connect to the MTJ.

According to another aspect of the present invention, a semiconductor device includes a magnetic tunneling junction (MTJ) on a substrate, a first inter-metal dielectric (IMD) layer around the MTJ, and a nitride layer on the MTJ.

According to yet another aspect of the present invention, a semiconductor device includes a magnetic tunneling junction (MTJ) on a substrate, a top electrode on the MTJ, a first inter-metal dielectric (IMD) layer around the MTJ, a second IMD layer on the first IMD layer, a metal interconnection in the second IMD layer and connected to the MTJ, and a bump adjacent to the metal interconnection. Preferably, a bottom surface of the bump is higher than a top surface of the top electrode.

According to yet another aspect of the present invention, a semiconductor device includes a first magnetic tunneling junction (MTJ) and a second MTJ on a substrate, a cap layer on sidewalls of the first MTJ and the second MTJ, a dielectric layer around the cap layer, a first metal interconnection on the first MTJ, the second MTJ, and the dielectric layer, and an inter-metal dielectric (IMD) layer around the dielectric layer and the first metal interconnection.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
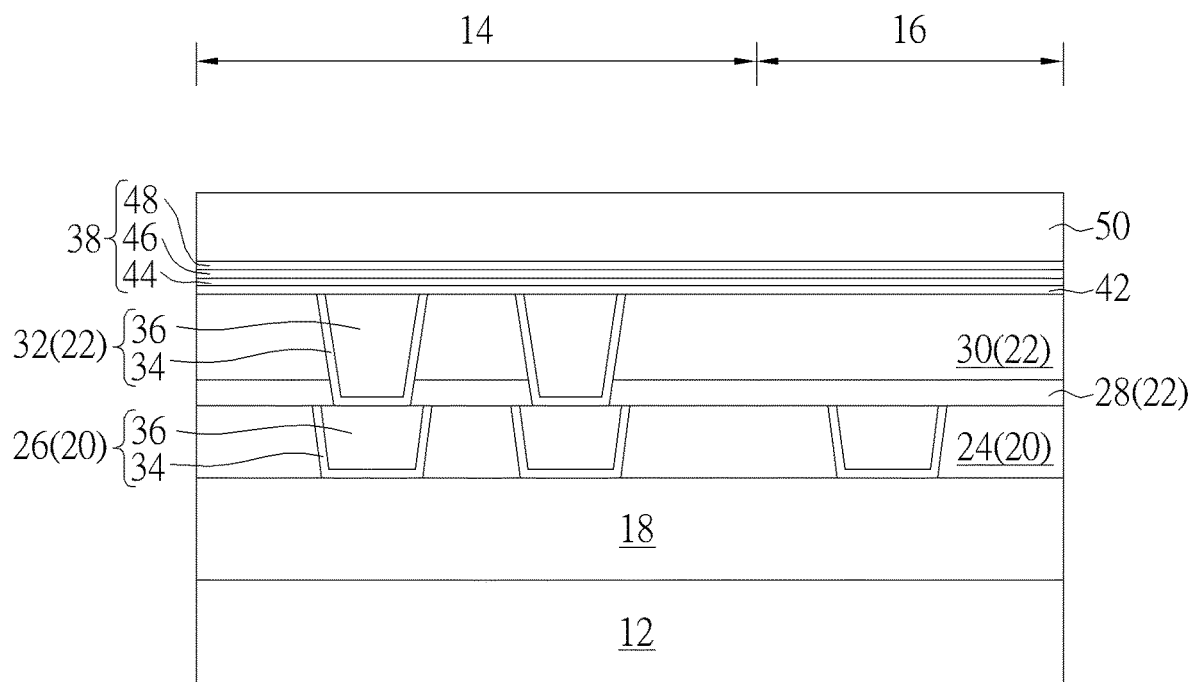
FIGS. 1-5 illustrate a method for fabricating a MRAM device according to an embodiment of the present invention.

Referring to FIGS. 1-5, FIGS. 1-5 illustrate a method for fabricating a MRAM device according to an embodiment of the present invention. As shown in FIG. 1, a substrate 12 made of semiconductor material is first provided, in which the semiconductor material could be selected from the group consisting of silicon (Si), germanium (Ge), Si—Ge compounds, silicon carbide (SiC), and gallium arsenide (GaAs), and a MRAM region 14 and a logic region 16 are defined on the substrate 12.

Active devices such as metal-oxide semiconductor (MOS) transistors, passive devices, conductive layers, and interlayer dielectric (ILD) layer 18 could also be formed on top of the substrate 12. More specifically, planar MOS transistors or non-planar (such as FinFETs) MOS transistors could be formed on the substrate 12, in which the MOS transistors could include transistor elements such as gate structures (for example metal gates) and source/drain region, spacer, epitaxial layer, and contact etch stop layer (CESL). The ILD layer 18 could be formed on the substrate 12 to cover the MOS transistors, and a plurality of contact plugs could be formed in the ILD layer 18 to electrically connect to the gate structure and/or source/drain region of MOS transistors. Since the fabrication of planar or non-planar transistors and ILD layer is well known to those skilled in the art, the details of which are not explained herein for the sake of brevity.

Next, metal interconnect structures 20, 22 are sequentially formed on the ILD layer 18 on the MRAM region 14 and the logic region 16 to electrically connect the aforementioned contact plugs, in which the metal interconnect structure 20 includes an inter-metal dielectric (IMD) layer 24 and metal interconnections 26 embedded in the IMD layer 24, and the metal interconnect structure 22 includes a stop layer 28, an IMD layer 30, and metal interconnections 32 embedded in the stop layer 28 and the IMD layer 30.

In this embodiment, each of the metal interconnections 26 from the metal interconnect structure 20 preferably includes a trench conductor and the metal interconnection 32 from the metal interconnect structure 22 on the MRAM region 14 includes a via conductor. Preferably, each of the metal interconnections 26, 32 from the metal interconnect structures 20, 22 could be embedded within the IMD layers 24, 30 and/or stop layer 28 according to a single damascene process or dual damascene process. For instance, each of the metal interconnections 26, 32 could further includes a barrier layer 34 and a metal layer 36, in which the barrier layer 34 could be selected from the group consisting of titanium (Ti), titanium nitride (TiN), tantalum (Ta), and tantalum nitride (TaN) and the metal layer 36 could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. In this embodiment, the metal layers 36 are preferably made of copper, the IMD layers 24, 30 are preferably made of silicon oxide, and the stop layers 28 is preferably made of nitrogen doped carbide (NDC), silicon nitride, silicon carbon nitride (SiCN), or combination thereof.

Next, a bottom electrode 42, a MTJ stack 38 or stack structure, a top electrode 50, and a patterned mask (not shown) are formed on the metal interconnect structure 22. In this embodiment, the formation of the MTJ stack 38 could be accomplished by sequentially depositing a pinned layer 44, a barrier layer 46, and a free layer 48 on the bottom electrode 42. In this embodiment, the bottom electrode layer 42 and the top electrode layer 50 are preferably made of conductive material including but not limited to for example Ta, Pt, Cu, Au, Al, or combination thereof. The pinned layer 44 could be made of ferromagnetic material including but not limited to for example iron, cobalt, nickel, or alloys thereof such as cobalt-iron-boron (CoFeB) or cobalt-iron (CoFe). Moreover, the pinned layer 44 could also be made of antiferromagnetic (AFM) material including but not limited to for example ferromanganese (FeMn), platinum manganese (PtMn), iridium manganese (IrMn), nickel oxide (NiO), or combination thereof, in which the pinned layer 44 is formed to fix or limit the direction of magnetic moment of adjacent layers. The barrier layer 46 could be made of insulating material including but not limited to for example oxides such as aluminum oxide ($AlO_x$) or magnesium oxide (MgO). The free layer 48 could be made of ferromagnetic material including but not limited to for example iron, cobalt, nickel, or alloys thereof such as cobalt-iron-boron (CoFeB), in which the magnetized direction of the free layer 48 could be altered freely depending on the influence of outside magnetic field.

Figure 2:
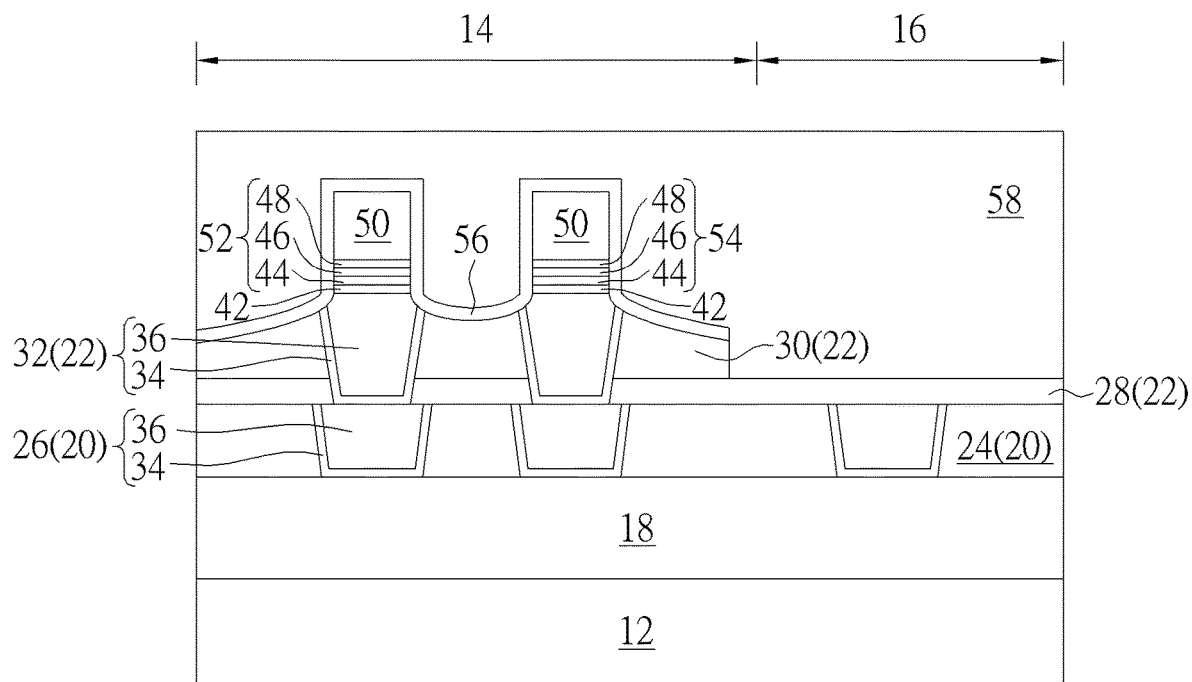

Next, as shown in FIG. 2, one or more etching process is conducted by using the patterned mask as mask to remove part of the top electrode 50, part of the MTJ stack 38, part of the bottom electrode 42, and part of the IMD layer 30 to form MTJs 52, 54 on the MRAM region 14. It should be noted that a reactive ion etching (ME) and/or an ion beam etching (IBE) process is conducted to remove the top electrode 50, MTJ stack 38, bottom electrode 42, and the IMD layer 38 in this embodiment for forming the MTJ 52. Due to the characteristics of the IBE process, the top surface of the remaining IMD layer 30 is slightly lower than the top surface of the metal interconnections 32 after the IBE process and the top surface of the IMD layer 30 also reveals a curve or an arc. It should also be noted that as the IBE process is conducted to remove part of the IMD layer 30, part of the metal interconnection 32 is removed at the same time to form inclined sidewalls on the surface of the metal interconnection 32 immediately adjacent to the MTJs 52, 54.

Next, a cap layer 56 is formed on the MTJs 52, 54 while covering the surface of the IMD layer 30, a photo-etching process is conducted to remove part of the cap layer 56 and part of the IMD layer 30 on the logic region 16 to expose the stop layer 28 underneath, and an IMD layer 58 is formed to cover the MTJs 52, 54. In this embodiment, the cap layer 56 preferably includes silicon nitride, but could also include other dielectric material including but not limited to for example silicon oxide, silicon oxynitride (SiON), or silicon carbon nitride (SiCN). The IMD layer 58 preferably include an ultra low-k (ULK) dielectric layer including but not limited to for example porous material or silicon oxycarbide (SiOC) or carbon doped silicon oxide (SiOCH).

Figure 3:
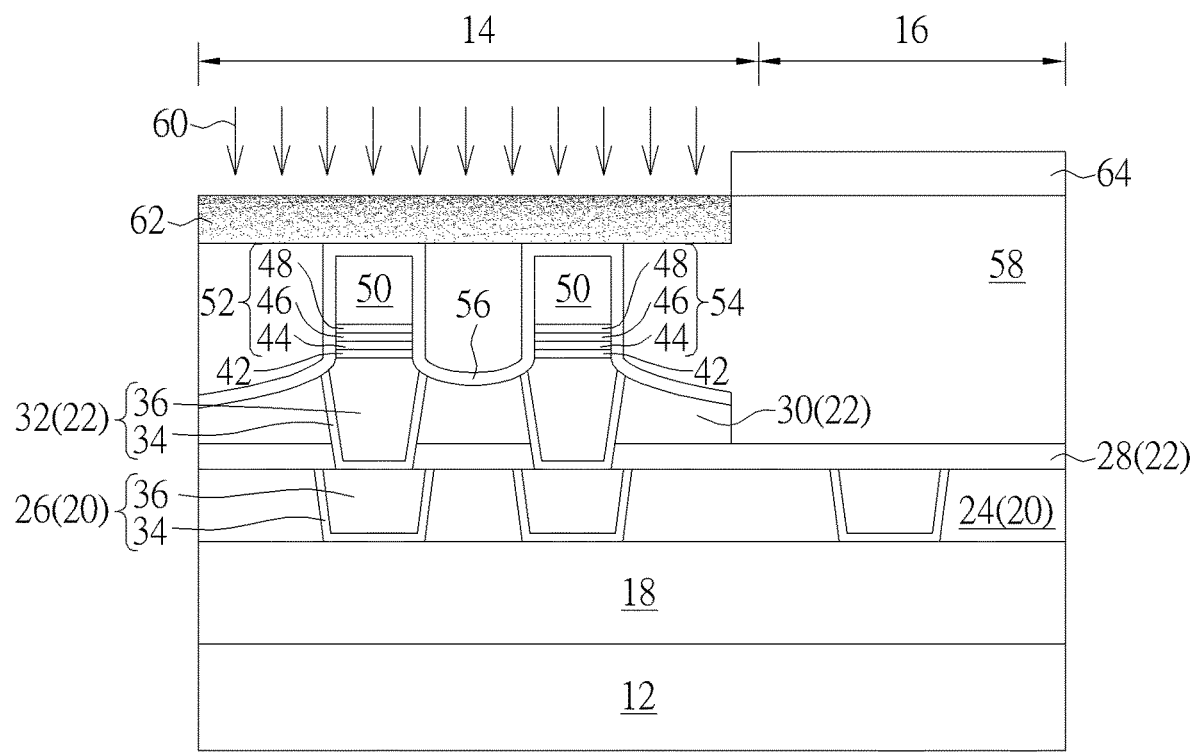

Next, as shown in FIG. 3, a nitridation process 60 is conducted to form a nitride layer 62 on the MTJs 52, 54. Specifically, the nitridation process 60 conducted at this stage is preferably accomplished by first forming a patterned mask 64 such as patterned resist on the logic region 16 and then conducting a nitrogen-based implantation process such as a plasma-enhanced chemical vapor deposition (PECVD) process to implant nitrogen gas ($N_2$) and/or ammonia gas ($NH_3$) into part of the IMD layer 58 directly above the MTJs 52, 54 on the MRAM region 14. This transforms part of the IMD layer 58 in to a nitride layer 62.

It should be noted that the nitridation process 60 conducted at this stage by implanting nitrogen atoms into the IMD layer 58 made of ULK dielectric layer preferably transforms part of IMD layer 58 made of SiOC or SiOCH into a nitride layer 62 made of SiOCN and the formation of the nitride layer 62 could be used to prevent formation of protrusions or bumps during formation of metal interconnections through dual damascene process in the later process due to soft nature of the porous IMD layer. Viewing from a more detailed perspective, the nitride layer 62 preferably includes a gradient nitrogen concentration, in which the nitrogen concentration of the nitride layer 62 decreases toward the MTJs 52, 54. In other words, the portion of the nitride layer 62 closer to the MTJs 52, 54 preferably includes lower nitrogen concentration while the portion of the nitride layer 62 away from the MTJs 52, 54 includes higher nitrogen concentration. It should be noted that even though the nitride layer 62 in this embodiment includes a gradient nitrogen concentration, according to other embodiments of the present invention it would also be desirable to adjust the concentration of nitrogen distribution during the nitridation process 60 so that the nitrogen atoms are distributed evenly throughout the entire nitride layer 62 instead of decreasing toward the MTJs 52, 54, which is also within the scope of the present invention.

Figure 4:
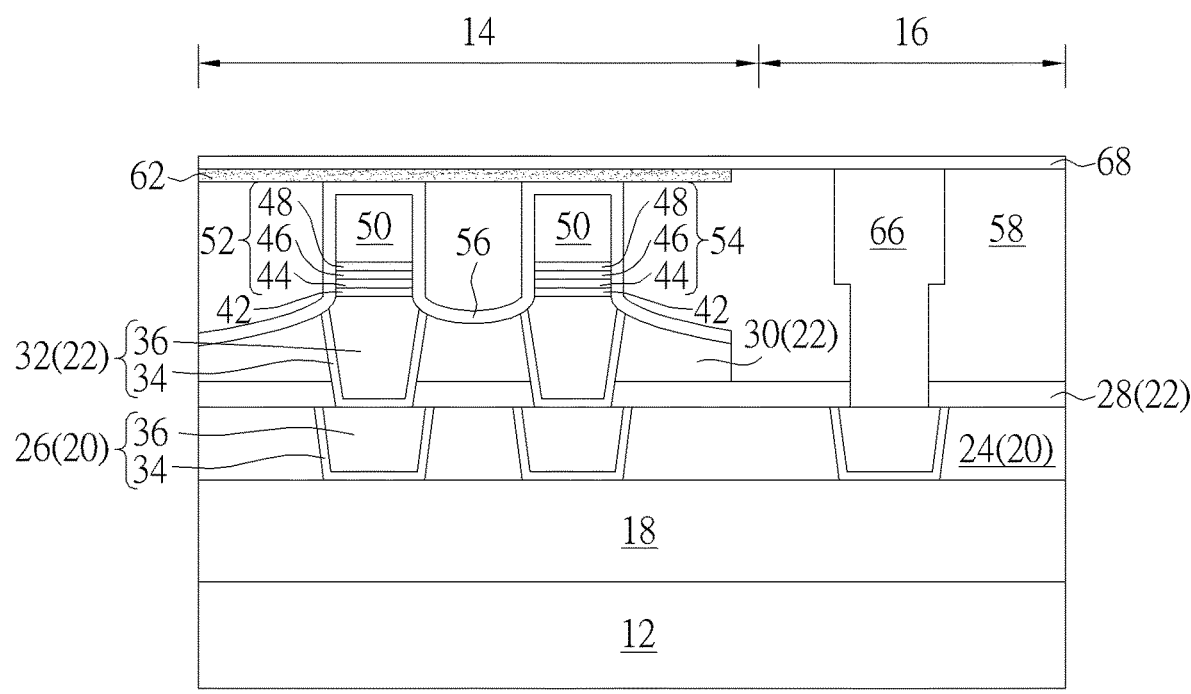

Next, as shown in FIG. 4, after stripping the patterned mask 64, a pattern transfer process is conducted by using a patterned mask (not shown) to remove part of the IMD layer 58 and part of the stop layer 28 on the logic region 16 to form a contact hole (not shown) exposing the metal interconnection 26 underneath and conductive materials are deposited into the contact hole afterwards. For instance, a barrier layer selected from the group consisting of titanium (Ti), titanium nitride (TiN), tantalum (Ta), and tantalum nitride (TaN) and metal layer selected from the group consisting of tungsten (W), copper (Cu), aluminum (Al), titanium aluminide (TiAl), and cobalt tungsten phosphide (CoWP) could be deposited into the contact hole, and a planarizing process such as CMP could be conducted to remove part of the conductive materials including the aforementioned barrier layer and metal layer to form a metal interconnection 66 in the contact hole electrically connecting the metal interconnection 26. Next, a stop layer 68 is formed on the nitride layer 62, the IMD layer 58, and metal interconnection 66, in which the stop layer 68 could include silicon oxide, silicon nitride, or SiCN.

Figure 5:
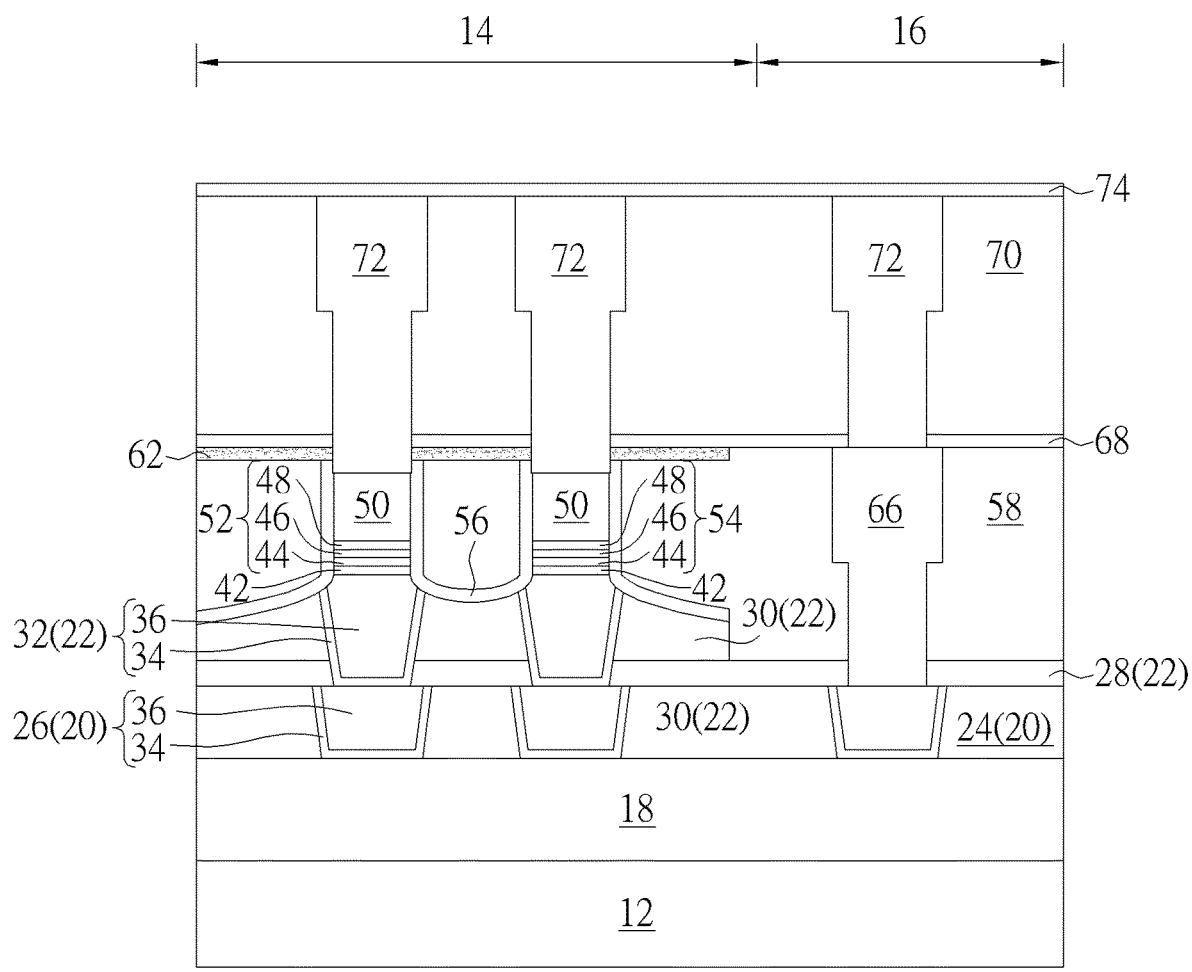

Next, as shown in FIG. 5, an IMD layer 70 is formed on the stop layer 68, and one or more photo-etching process is conducted to remove part of the IMD layer 70, part of the stop layer 68, and part of the nitride layer 62 on the MRAM region 14 and part of the IMD layer 70 and part of the stop layer 68 on the logic region 16 to form contact holes (not shown). Next, conductive materials are deposited into each of the contact holes and a planarizing process such as CMP is conducted to form metal interconnections 72 connecting the MTJs 52, 54 and metal interconnection 66 underneath, in which the metal interconnection 72 on the MRAM region 14 directly contacts the top electrode 50 underneath while the metal interconnection 72 on the logic region 16 directly contacts the metal interconnection 66 on the lower level. Next, another stop layer 74 is formed on the IMD layer 70 to cover the metal interconnections 72.

In this embodiment, the stop layers 68 and 74 could be made of same or different materials, in which the two layers 68, 74 could all include nitrogen doped carbide (NDC), silicon nitride, silicon carbon nitride (SiCN), or combination thereof. Similar to the metal interconnections formed previously, each of the metal interconnections 72 could be formed in the IMD layer 70 through a single damascene or dual damascene process. For instance, each of the metal interconnections 72 could further include a barrier layer and a metal layer, in which the barrier layer could be selected from the group consisting of titanium (Ti), titanium nitride (TiN), tantalum (Ta), and tantalum nitride (TaN) and the metal layer could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. This completes the fabrication of a semiconductor device according to an embodiment of the present invention.

Figure 6:
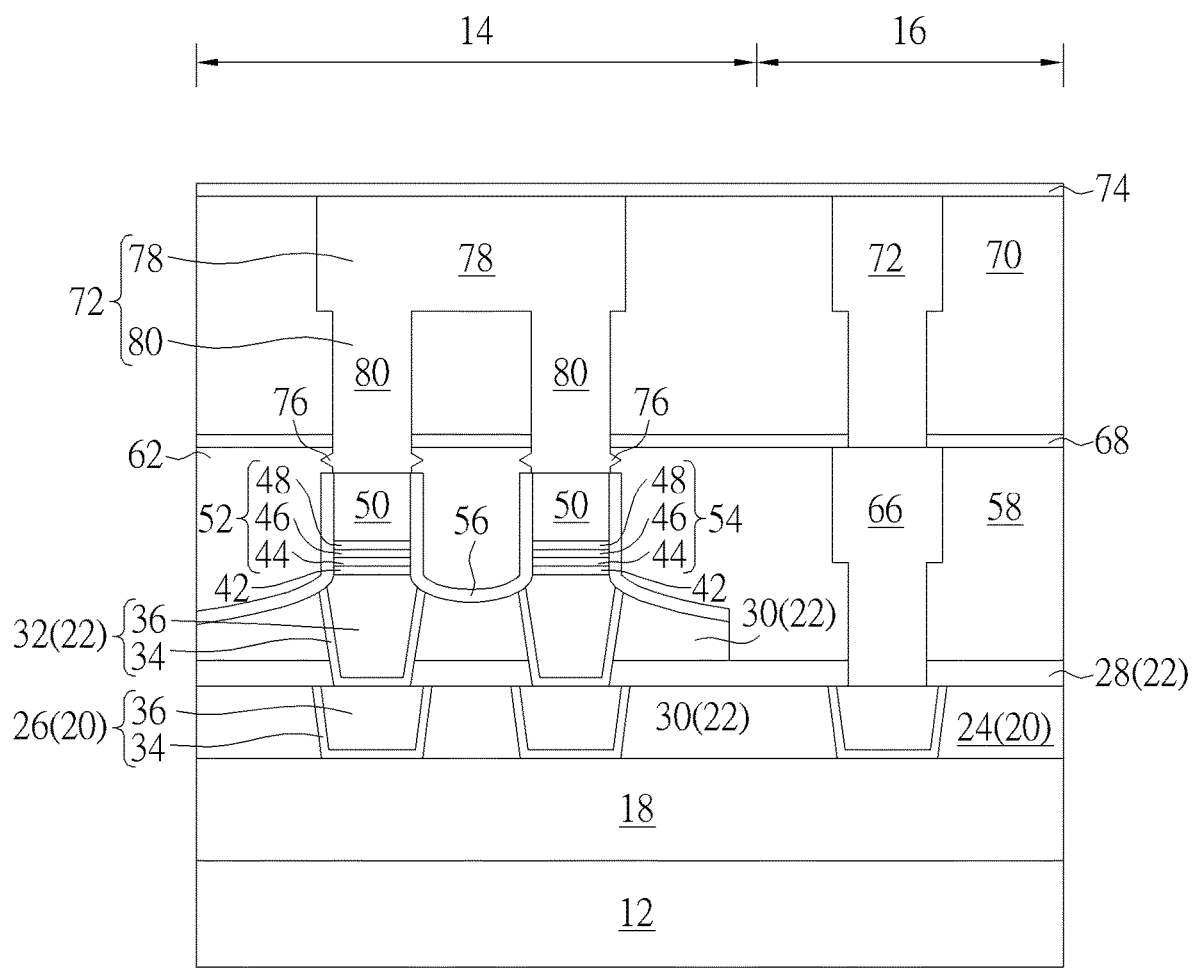
FIG. 6 illustrates a structural view of a semiconductor device according to an embodiment of the present invention.

Referring to FIG. 6, FIG. 6 illustrates a structural view of a semiconductor device according to an embodiment of the present invention. For simplicity purpose, elements from the aforementioned embodiments are labeled with same numberings. As shown in FIG. 6, the semiconductor device preferably includes MTJs 52, 54 disposed on the substrate 12, a top electrode 50 disposed on top of each of the MTJs 52, 54, a cap layer 56 surrounding the top electrodes 50 and the MTJs 52, 54, an IMD layer 58 around the MTJs 52, 54, an IMD layer 70 disposed on the IMD layer 58, metal interconnections 72 disposed in the IMD layer 70 to connect to the MTJs 52, 54, and bumps 76 disposed adjacent to the metal interconnections 72. In this embodiment, the metal interconnection 72 disposed on the MRAM region 14 further includes a trench conductor 78 and two via conductors 80 connected to the MTJs 52, 54 respectively, in which the bumps 76 are disposed on sidewalls of each of the via conductors 80.

It should be noted that if no nitride layer 62 were formed on the top electrodes 50 to serve as a cushion or buffer as disclosed in the aforementioned embodiment, protrusions or bumps 76 could be formed on two sidewalls of each of the via conductors 80 in proximity to the top electrodes 50 during formation of the metal interconnections 72 through dual damascene process. Specifically, each of the bumps 76 could include a triangular shape or other irregular shape, the bumps 76 are formed on two sides of the via conductors 80 to directly contact the IMD layer 58 and without contacting the stop layer 68, the top electrodes 50, and/or the cap layer 68 directly, the bottom surface of the bumps 76 is higher than the top surfaces of the top electrodes 50 and the cap layer 56, and the top surface of the bumps 76 is slightly lower than the top surface of the metal interconnection 66 on the logic region 16. It should be noted that since the bumps 76 and metal interconnections 72 are fabricated under same process through the dual damascene processes disclosed previously, the two elements 72, 76 are preferably made of same material including but not limited to for example copper.

Figure 7:
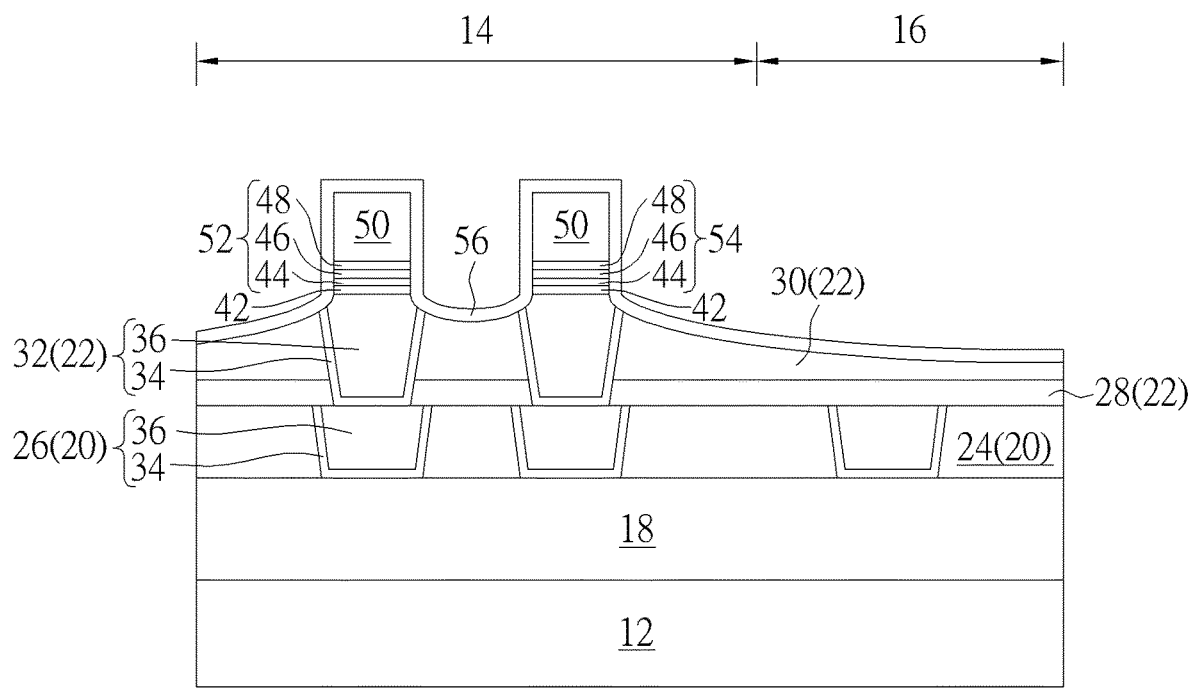
FIGS. 7-10 illustrate a method for fabricating a MRAM device according to an embodiment of the present invention.

Referring to FIGS. 7-10, FIGS. 7-10 illustrate a method for fabricating a MRAM device according to an embodiment of the present invention. For simplicity purpose, elements from the aforementioned embodiments are labeled with same numberings. As shown in FIG. 7, a substrate 12 made of semiconductor material is first provided, in which the semiconductor material could be selected from the group consisting of silicon (Si), germanium (Ge), Si—Ge compounds, silicon carbide (SiC), and gallium arsenide (GaAs), and a MRAM region 14 and a logic region 16 are defined on the substrate 12.

Active devices such as metal-oxide semiconductor (MOS) transistors, passive devices, conductive layers, and interlayer dielectric (ILD) layer 18 could also be formed on top of the substrate 12. More specifically, planar MOS transistors or non-planar (such as FinFETs) MOS transistors could be formed on the substrate 12, in which the MOS transistors could include transistor elements such as gate structures (for example metal gates) and source/drain region, spacer, epitaxial layer, and contact etch stop layer (CESL). The ILD layer 18 could be formed on the substrate 12 to cover the MOS transistors, and a plurality of contact plugs could be formed in the ILD layer 18 to electrically connect to the gate structure and/or source/drain region of MOS transistors. Since the fabrication of planar or non-planar transistors and ILD layer is well known to those skilled in the art, the details of which are not explained herein for the sake of brevity.

Next, metal interconnect structures 20, 22 are sequentially formed on the ILD layer 18 on the MRAM region 14 and the logic region 16 to electrically connect the aforementioned contact plugs, in which the metal interconnect structure 20 includes an inter-metal dielectric (IMD) layer 24 and metal interconnections 26 embedded in the IMD layer 24, and the metal interconnect structure 22 includes a stop layer 28, an IMD layer 30, and metal interconnections 32 embedded in the stop layer 28 and the IMD layer 30.

In this embodiment, each of the metal interconnections 26 from the metal interconnect structure 20 preferably includes a trench conductor and the metal interconnection 32 from the metal interconnect structure 22 on the MRAM region 14 includes a via conductor. Preferably, each of the metal interconnections 26, 32 from the metal interconnect structures 20, 22 could be embedded within the IMD layers 24, 30 and/or stop layer 28 according to a single damascene process or dual damascene process. For instance, each of the metal interconnections 26, 32 could further includes a barrier layer 34 and a metal layer 36, in which the barrier layer 34 could be selected from the group consisting of titanium (Ti), titanium nitride (TiN), tantalum (Ta), and tantalum nitride (TaN) and the metal layer 36 could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. In this embodiment, the metal layers 36 are preferably made of copper, the IMD layers 24, 30 are preferably made of silicon oxide, and the stop layers 28 is preferably made of nitrogen doped carbide (NDC), silicon nitride, silicon carbon nitride (SiCN), or combination thereof.

Next, a bottom electrode 42, a MTJ stack 38 or stack structure, a top electrode 50, and a patterned mask (not shown) are formed on the metal interconnect structure 22. In this embodiment, the formation of the MTJ stack 38 could be accomplished by sequentially depositing a pinned layer 44, a barrier layer 46, and a free layer 48 on the bottom electrode 42. In this embodiment, the bottom electrode layer 42 and the top electrode layer 50 are preferably made of conductive material including but not limited to for example Ta, Pt, Cu, Au, Al, or combination thereof. The pinned layer 44 could be made of ferromagnetic material including but not limited to for example iron, cobalt, nickel, or alloys thereof such as cobalt-iron-boron (CoFeB) or cobalt-iron (CoFe). Moreover, the pinned layer 44 could also be made of antiferromagnetic (AFM) material including but not limited to for example ferromanganese (FeMn), platinum manganese (PtMn), iridium manganese (IrMn), nickel oxide (NiO), or combination thereof, in which the pinned layer 44 is formed to fix or limit the direction of magnetic moment of adjacent layers. The barrier layer 46 could be made of insulating material including but not limited to for example oxides such as aluminum oxide ($AlO_x$) or magnesium oxide (MgO). The free layer 48 could be made of ferromagnetic material including but not limited to for example iron, cobalt, nickel, or alloys thereof such as cobalt-iron-boron (CoFeB), in which the magnetized direction of the free layer 48 could be altered freely depending on the influence of outside magnetic field.

Next, one or more etching process is conducted by using the patterned mask as mask to remove part of the top electrode 50, part of the MTJ stack 38, part of the bottom electrode 42, and part of the IMD layer 30 to form MTJs 52, 54 on the MRAM region 14. It should be noted that a reactive ion etching (ME) and/or an ion beam etching (IBE) process is conducted to remove the top electrode 50, MTJ stack 38, bottom electrode 42, and the IMD layer 38 in this embodiment for forming the MTJ 52. Due to the characteristics of the IBE process, the top surface of the remaining IMD layer 30 is slightly lower than the top surface of the metal interconnections 32 after the IBE process and the top surface of the IMD layer 30 also reveals a curve or an arc. It should also be noted that as the IBE process is conducted to remove part of the IMD layer 30, part of the metal interconnection 32 is removed at the same time to form inclined sidewalls on the surface of the metal interconnection 32 immediately adjacent to the MTJs 52, 54. Next, a cap layer 56 is formed on the MTJs 52, 54 while covering the surface of the IMD layer 30. In this embodiment, the cap layer 56 preferably includes silicon nitride, but could also include other dielectric material including but not limited to for example silicon oxide, silicon oxynitride (SiON), or silicon carbon nitride (SiCN).

Figure 8:
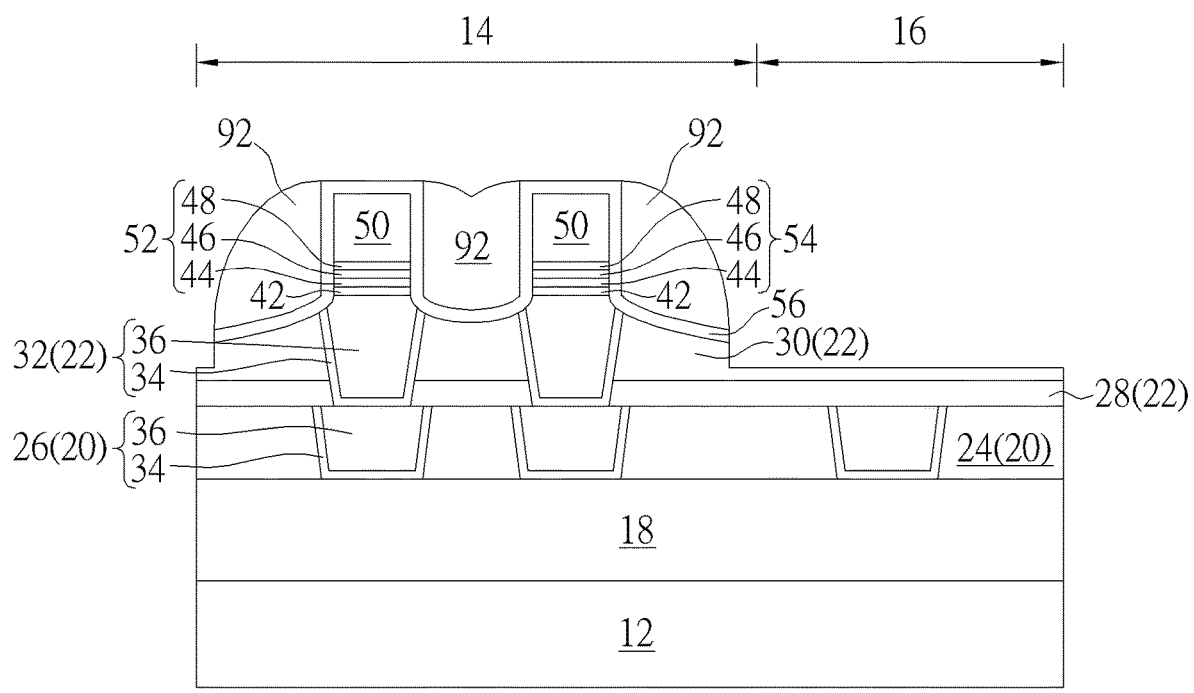

Next, as shown in FIG. 8, an atomic layer deposition (ALD) process is conducted to form a dielectric layer 92 on the MTJs 52, 54, and an etching back process is conducted to remove part of the dielectric layer 92, part of the cap layer 56, and part of the IMD layer 30 on the MRAM region 14 and logic region 16 so that the remaining dielectric layer 92 is only disposed around the MTJs 52, 54 on the MRAM region 14 or on left side of the MTJ 52, on right side of the MTJ 54, and between the two MTJs 52, 54. It should be noted that even though the IMD layer 30 on the MRAM region 14 and logic region 16 in particular are remained without exposing the stop layer 28 underneath during the removal of the IMD layer 92, according to other embodiment of the present invention, it would also be desirable to remove all of the IMD layer 30 on the logic region 16 to expose the stop layer 28 underneath after the IMD layer 92 is removed, which is also within the scope of the present invention.

Figure 9:
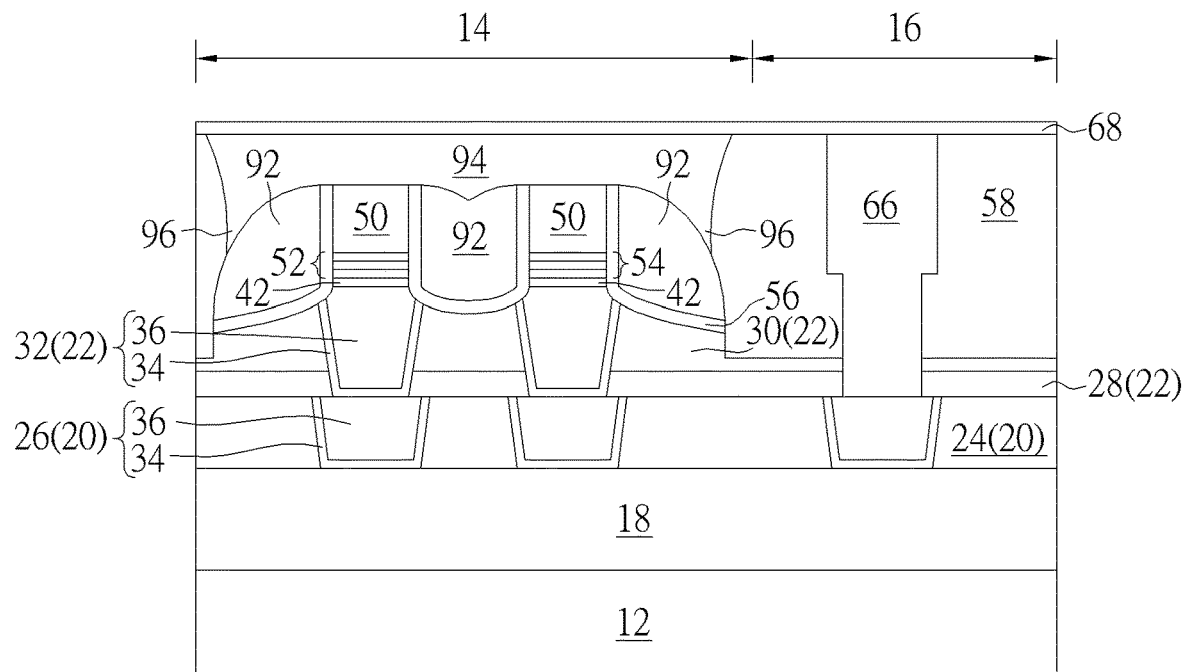

Next, as shown in FIG. 9, an IMD layer 58 is formed on the MRAM region 14 and logic region 16 to cover the dielectric layer 92, and a planarizing process such as CMP is conducted to remove part of the IMD layer 58 so that the remaining IMD layer 58 includes a planar top surface. In this embodiment, the dielectric layer 92 preferably includes silicon oxide while the IMD layer 58 preferably include an ultra low-k (ULK) dielectric layer including but not limited to for example porous material or silicon oxycarbide (SiOC) or carbon doped silicon oxide (SiOCH).

Next, a pattern transfer process is conducted by using a patterned mask (not shown) to remove part of the IMD layer 58, part of the dielectric layer 92, and part of the cap layer 56 on the MRAM region 14 to form a contact hole (not shown) exposing the top electrodes 50 underneath, and conductive materials are deposited into the contact hole afterwards. For instance, a barrier layer selected from the group consisting of titanium (Ti), titanium nitride (TiN), tantalum (Ta), and tantalum nitride (TaN) and metal layer selected from the group consisting of tungsten (W), copper (Cu), aluminum (Al), titanium aluminide (TiAl), and cobalt tungsten phosphide (CoWP) could be deposited into the contact hole, and a planarizing process such as CMP could be conducted to remove part of the conductive materials including the aforementioned barrier layer and metal layer to form a metal interconnection 94 in the contact hole electrically connecting the MTJs 52, 54.

It should be noted that since the dielectric layer 92 on left and right sides of the MTJs 52, 54 reveals curved profile after being deposited through ALD process, the portion of metal interconnection 94 directly contacting the dielectric layer 92 thereby forms tapered portions 96 accordingly. In this embodiment, the bottommost surface or portion of the tapered portions 96 is between the top electrodes 50 and bottom electrodes 42, according to other embodiment of the present invention it would also be desirable to adjust the position of the tapered portions 96 so that the bottommost point or portion of the tapered portions 96 could be higher than the bottom surface of the top electrodes 50 or lower than the bottom surface of the MTJs 52, 54, which are all within the scope of the present invention.

Next, another pattern transfer process is conducted by using a patterned mask (not shown) to remove part of the IMD layer 58, part of the IMD layer 30, and part of the stop layer 28 on the logic region 16 to form a contact hole (not shown) exposing the metal interconnection 26 underneath and conductive materials are deposited into the contact hole afterwards. For instance, a barrier layer selected from the group consisting of titanium (Ti), titanium nitride (TiN), tantalum (Ta), and tantalum nitride (TaN) and metal layer selected from the group consisting of tungsten (W), copper (Cu), aluminum (Al), titanium aluminide (TiAl), and cobalt tungsten phosphide (CoWP) could be deposited into the contact hole, and a planarizing process such as CMP could be conducted to remove part of the conductive materials including the aforementioned barrier layer and metal layer to form a metal interconnection 66 in the contact hole electrically connecting the metal interconnection 26. Next, a stop layer 68 is formed on the IMD layer 58 and metal interconnections 66, 94, in which the stop layer 68 could include silicon oxide, silicon nitride, or SiCN.

Figure 10:
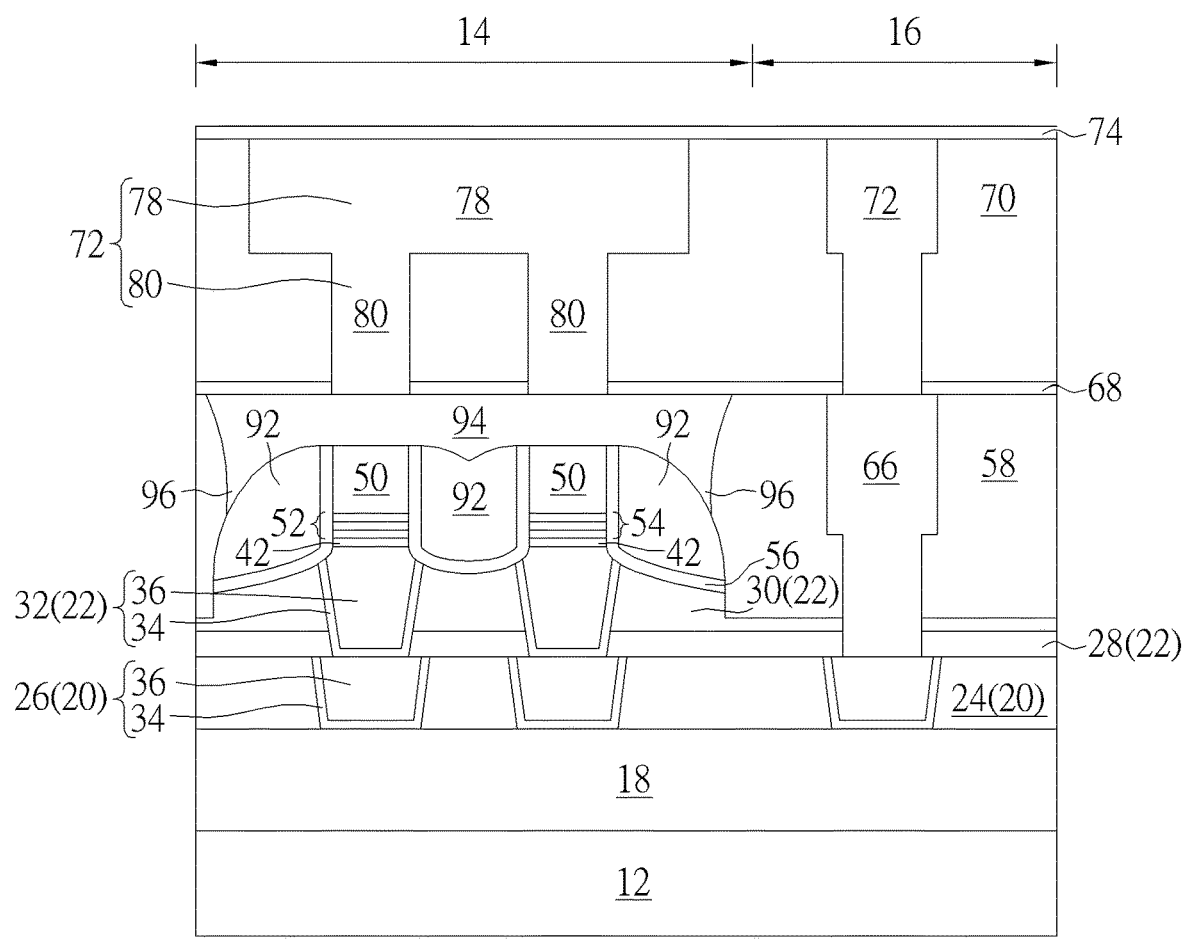

Next, as shown in FIG. 10, an IMD layer 70 is formed on the stop layer 68, and one or more photo-etching process is conducted to remove part of the IMD layer 70 and part of the stop layer 68 on the MRAM region 14 and logic region 16 to form contact holes (not shown). Next, conductive materials are deposited into each of the contact holes and a planarizing process such as CMP is conducted to form metal interconnections 72 connecting the MTJs 52, 54 and metal interconnection 66 underneath, in which the metal interconnection 72 on the MRAM region 14 directly contacts the metal interconnection 94 underneath while the metal interconnection 72 on the logic region 16 directly contacts the metal interconnection 66 on the lower level. Next, another stop layer 74 is formed on the IMD layer 70 to cover the metal interconnections 72. Similar to the embodiment shown in FIG. 6, the metal interconnection 72 disposed on the MRAM region 14 further includes a trench conductor 78 and two via conductors 80 connected to the metal interconnection 94 underneath.

In this embodiment, the stop layers 68 and 74 could be made of same or different materials, in which the two layers 68, 74 could all include nitrogen doped carbide (NDC), silicon nitride, silicon carbon nitride (SiCN), or combination thereof. Similar to the metal interconnections formed previously, each of the metal interconnections 72 could be formed in the IMD layer 70 through a single damascene or dual damascene process. For instance, each of the metal interconnections 72 could further include a barrier layer and a metal layer, in which the barrier layer could be selected from the group consisting of titanium (Ti), titanium nitride (TiN), tantalum (Ta), and tantalum nitride (TaN) and the metal layer could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. This completes the fabrication of a semiconductor device according to an embodiment of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a magnetic tunneling junction (MTJ) on a substrate;
   a first inter-metal dielectric (IMD) layer around the MTJ;
   a nitride layer on the MTJ; and
   a stop layer on and directly contacting the nitride layer.

2. The semiconductor device of claim 1, wherein the substrate comprises a magnetic random access memory (MRAM) region and a logic region, the semiconductor device comprising:
   a first metal interconnection on the logic region;
   the stop layer on the nitride layer and the first metal interconnection;
   a second IMD layer on the stop layer; and
   a second metal interconnection in the second IMD layer and connected to the MTJ, wherein the nitride layer is around the second metal interconnection.

3. The semiconductor device of claim 2, wherein top surfaces of the nitride layer and the first metal interconnection are coplanar.

4. The semiconductor device of claim 1, wherein the nitride layer comprises a gradient nitrogen concentration.

5. The semiconductor device of claim 1, wherein a nitrogen concentration of the nitride layer decreases toward the MTJ.

* * * * *